US005773331A

United States Patent [19]
Solomon et al.

[11] Patent Number: 5,773,331
[45] Date of Patent: Jun. 30, 1998

[54] METHOD FOR MAKING SINGLE AND DOUBLE GATE FIELD EFFECT TRANSISTORS WITH SIDEWALL SOURCE-DRAIN CONTACTS

[75] Inventors: Paul Michael Solomon, Yorktown Heights; Hon-Sum Philip Wong, Chappaqua, both of N.Y.

[73] Assignee: International Business Machines Corporation, Armonk, N.Y.

[21] Appl. No.: 767,916

[22] Filed: Dec. 17, 1996

[51] Int. Cl.$^6$ .................................................. H01L 21/86
[52] U.S. Cl. ..................... 438/164; 438/163; 438/596; 438/157
[58] Field of Search ..................... 438/164, 163, 438/149, 157, 482, 491, 596; 148/DIG. 150

[56] References Cited

U.S. PATENT DOCUMENTS

| | | | |
|---|---|---|---|
| 4,714,685 | 12/1987 | Schubert | 438/297 |
| 4,797,718 | 1/1989 | Schubert | 257/387 |
| 5,019,525 | 5/1991 | Virkus et al. | 438/164 |
| 5,027,177 | 6/1991 | Vasudev | 257/290 |
| 5,166,084 | 11/1992 | Pfiester | 438/151 |
| 5,262,655 | 11/1993 | Ashida | 438/163 |
| 5,273,921 | 12/1993 | Neudeck et al. | 438/157 |
| 5,289,027 | 2/1994 | Terrill et al. | 257/327 |
| 5,346,839 | 9/1994 | Sundaresan | 438/311 |
| 5,348,899 | 9/1994 | Dennison et al. | 438/157 |
| 5,376,561 | 12/1994 | Vu et al. | 438/118 |
| 5,420,048 | 5/1995 | Kondo | 438/157 |
| 5,461,250 | 10/1995 | Burghartz et al. | 438/157 |

FOREIGN PATENT DOCUMENTS 19524027  1/1996  Germany .

*Primary Examiner*—Michael Trinh

[57] ABSTRACT

The present invention concerns single-gate and double-gate field effect transistors having a sidewall source contact and a sidewall drain contact, and methods for making such field effect transistors. The channel of the present field effect transistors is raised with respect to the support structure underneath and the source and drain regions form an integral part of the channel.

10 Claims, 7 Drawing Sheets

METHOD FOR MAKING SINGLE AND DOUBLE GATE FIELD EFFECT TRANSISTORS WITH SIDEWALL SOURCE-DRAIN CONTACTS

TECHNICAL FIELD

The present invention relates to single and double gate field effect transistors (FETs), and in particular FETs formed on a silicon-on-insulator (SOI) substrate. It also relates to a method for making such FETs.

BACKGROUND OF THE INVENTION

In order to be able to make integrated circuits (ICs), such as memory, logic and other devices, of higher integration density than currently feasible, one has to find a way to further scale down field effect transistor (FETs). FETs are important components of many such ICs.

As FET dimensions are scaled down, it becomes increasingly more difficult to control short-channel effects by conventional techniques. An evolution beyond the standard metal oxide semiconductor field effect transistor (MOSFET) is the double-gate MOSFET, where the channel is confined between top and bottom gate. This structure, with a symmetrical gate structure, can be scaled to about half of the channel length compared to the conventional structure.

The following references pertain to FETs and some of them specifically to double-gate FETs.

I. Yang et al. demonstrate in their article "Back gated CMOS on SOIAS for dynamic threshold voltage control", 1995 IEDM Technical Digest, pp. 877–880, the use of a bottom gate to control the threshold voltage and thereby to manage the power dissipation of an integrated circuit. In this article also the use of Silicon-on-insulator (SOI) to make a bottom gate is described. The bottom gate of the devices described in this article are not self-aligned and thus incur a large penalty in parasitic capacitance to the ground plate.

T. Yoshimoto et al. demonstrate in their article "Silicided Silicon-sidewall source and drain ($S^4D$) structure for high-performance 75-nm gate length pMOSFETs", 1995 Symposium on VLSI Technology Digest of Technical Papers, pp. 11–12, the use of a silicided amorphous silicon sidewall to contact the source and drain. The present invention, as will be described later, goes further in that the amorphous silicon sidewall is itself used as an etch mask to etch through the horizontal silicon area outside of the sidewall after it has been etched through, thus eliminating the horizontal extension of the source and drain away from the channel. This has the advantage that parasitic effects are drastically reduced. It is furthermore to be noted, that the pMOSFET described by T. Yoshimoto et al. does only have a single gate.

In U.S. Pat. Nos. 5,158,898 and 5,235,189 thin film transistors are described. Such thin film transistors generally do not have a single crystal channel. The thin film transistors described are suited for thin film displays etc., but not for complementary metal oxide semiconductor (CMOS) very large scale integration (VLSI). These thin film transistors differ from the structures presented and claimed herein by the following features. The channel and source/drain regions are deposited conformally over a dielectric groove so that it cannot be single crystal. The drain is not formed separately and then etched back to form a sidewall. The thin film transistor has a bottom gate but no top gate. The bottom gate is not delineated using the top gate and source/drain sidewalls as a mask. Furthermore, the source and drain contacts are from the top (not from the side) and do not use a self-aligned silicide.

In U.S. Pat. No. 5,188,973 a double-gate structure is described. The bottom gate of this structure is not self-aligned to the top gate so that it cannot offer an alternative to the present invention. Furthermore, the process and design philosophy is very different from the one presented hereinafter.

In U.S. Pat. No. 5,185,535 means for controlling the threshold voltage of a CMOS transistor are addressed. This is achieved by means of separately contacted wells. Apart from the capability to control the threshold voltage, there is nothing else in common with the present invention.

Another double-gate transistor is addressed in U.S. Pat. No. 5,140,391. It has no sidewall source and drain. The bottom gate of this transistor is patterned before the channel region is grown and this gate is not aligned with respect to the top gate, just to mention some differences.

In U.S. Pat. No. 5,349,228 another double-gate transistor is described and claimed. This transistor has no sidewall source and drain. The fact that the bottom gate has to be oxidized limits the choice of bottom gate materials. The bottom gate oxide is formed before the channel which precludes the use of high quality grown silicon/silicon-dioxide interfaces for the bottom oxide.

So far, methods for fabricating double-gate FETs have either been very complex, or have severe drawbacks in terms of parameter control. Some of the structures known in the art have an excessive parasitic capacitance to the bottom gate. There is no structure known which has a comparable self-aligned double gate structure. In particular no self-aligned double gate structure integrated on a SOI substrate is known.

It is an object of the present invention to provide a method for making single-gate and double-gate field effect transistors which is compatible with current IC fabrication techniques.

It is an object of the present invention to provide single-gate and double-gate field effect transistors having a low parasitic capacitance to the bottom gate and a reduced drain and source resistance.

It is another object of the present invention to provide a method which is suited for use in a manufacturing line.

SUMMARY OF THE INVENTION

The present invention concerns a method for making a field effect transistor. The inventive method comprises the following steps:

(a) forming a channel layer, (b) forming a top gate insulator layer on said channel layer, (c) forming a top gate on said top gate insulator layer, (d) forming a gate pillar on said top gate, (e) forming insulating sidewall layers adjacent to said top gate and gate pillar, (f) forming a integral drain region and source region within said channel layer by introduction of dopants, (g) forming conductive amorphous silicon sidewalls on either side of, and adjacent to said insulating sidewall layers, one of said amorphous silicon sidewalls being connected to said drain region and one being connected to said source region, (h) etching said channel layer using said top gate, gate pillar, insulating sidewall layers, and amorphous silicon sidewalls as mask, thereby transferring the lateral extension of said mask into said channel layer, providing for a channel with integral drain region and source region being raised with respect to said support structure.

This method, and modifications thereof, allow to make novel and inventive single gate and double gate field effect transistors, as will be described later.

It is an advantage of the present method that the performance and controllability of the respective FETs is improved.

It is another advantage of the inventive method and structure that the parasitic capacitance to the bottom gate is very low, because the top gate is properly aligned with respect to the bottom gate. Since a self-aligning approach is used, high reproducibility is ensured. The parasitic capacitance is about ½ and less that of a conventional non-sidewall drain, non-self-aligned structure.

The present invention allows to make compact single-gate and double-gate structures. The density at which the structures can be made is comparable to conventional (single-gate) CMOS, and allows closer than conventional spacing of p- and n-channel transistors with a shared contact.

Furthermore, the present devices show good transport properties in the planar silicon channel. In addition, the resistance of source and drain is reduced due to the 'raised' source/drain type structure.

It is also an advantage of the present structure that both the top and bottom gate layers are independently accessible from outside, i.e., independent wiring layer can be used.

The starting layers (layers 31, 32, 33 see FIG. 3A) are unpersonalized. The bottom gate is not structured (patterned) prior to the fabrication of the channel layer. This is very important since it permits the build up of an inventory of starting wafers (partially processed wafers) and the attainment of a high degree of perfection for these wafers. The post starting layer fabrication uses extensions of conventional silicon integrated circuit technology and utilizes the conventional materials set.

DESCRIPTION OF THE DRAWINGS

The invention is described in detail below with reference to the following schematic drawings.

DETAILED DESCRIPTION OF THE PRESENT INVENTION

The expression support structure used hereinafter is meant to cover any kind of substrate, including semiconductor substrates, substrates comprising an insulating top layer, and the like. Such a support structure may comprise different semiconductor layers and other kind of layers. Other semiconductor devices may be integrated into the same support structure. When referring to a "sidewall", any kind of surface of a semiconductor structure is meant which is sloped with respect to the plane of the substrate. Of particular importance are sidewalls which are perpendicular with respect to said substrate's plane. When referring to a "raised" channel, for example, a channel is meant which is elevated with respect to the layers or support structure underneath, as opposed to a channel being integrated into the layers or support structure underneath.

For clarity, the below description is for specific implementations of the present invention using silicon integrated circuit technology. In a more general implementation other materials may be substituted while retaining the key features of the invention.

Figure 1:
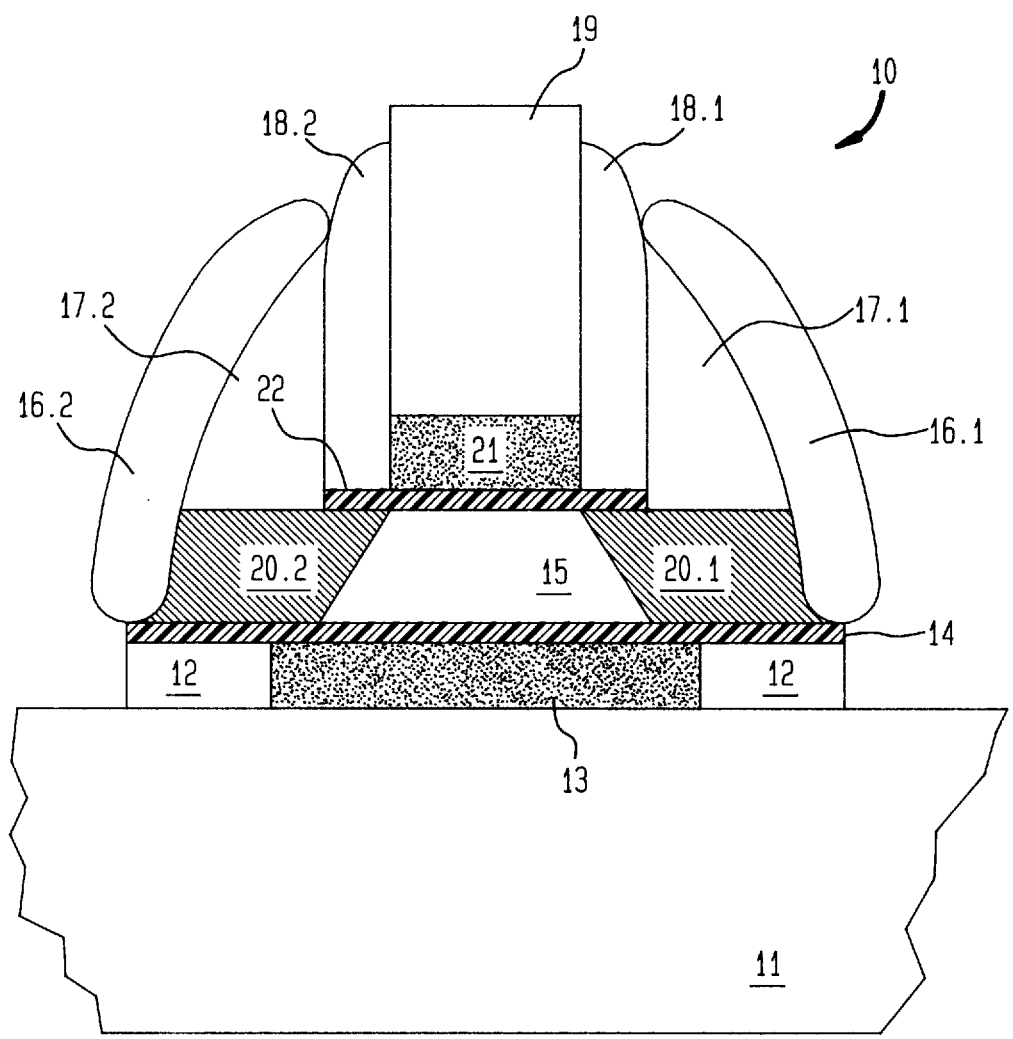
FIG. 1 is a schematic cross-section of a first self-aligned double gate field effect transistor according to the present invention.

A cross-sectional view of a first double-gate FET 10, according to the present invention, is illustrated in FIG. 1. A schematic view of the four lithographic masks used to make the FET 10, is given in FIG. 2.

The FET 10 is situated on a substrate 11 and basically comprises a bottom gate 13, made of Tungsten for example, protected by bottom gate sidewall insulators 12. $SiO_2$ is well suited as insulator 12. On top of the bottom gate 13, a thin bottom gate insulator 14 is situated. In the present example this insulator 14 comprises $SiO_2$. The semiconductor channel region 15 and the heavily doped source- and drain regions 20.1 and 20.2 are formed on top of the insulator 14. Between the top gate 21 and the channel region 15 another thin insulator 22, referred to as top gate insulator, is situated. The top gate 21 may comprise Tungsten, for example. On top of the top gate 21 a gate pillar 19 is formed. This gate pillar 19 may comprise silicon nitride. The sidewalls of the top gate 21 and the gate pillar 19 is at least partially covered by top gate sidewall insulators 18.1 and 18.2 comprising $SiO_2$, for example. Source and drain sidewall extensions 17.1 and 17.2 are deposited adjacent to said top gate sidewall insulators 18.1 and 18.2 and are carried by the source and drain regions 20.1 and 20.1. The source and drain sidewall extensions 17.1 and 17.2 are made of amorphous silicon. Then, source and drain contacts 16.1 and 16.2 are formed. They make contact to the respective sidewall extensions 17.1, 17.2 and the source- and drain regions 20.1, 20.2. Metal suicides are well suited as source and drain contacts 16.1 and 16.2.

Typical dimensions of the layers of the FET 10 are given below. The thickness of the respective layers and the material according to the present embodiment are specified in parentheses:

Semiconductor channel 15 between 1 nm and 50 nm (10 nm Silicon);
bottom gate insulator 14 between 1 nm and 10 nm (4 nm $SiO_2$);
bottom gate 13 between 5 nm and 100 nm (25 nm Tungsten);
bottom gate sidewall insulator 12 between 5 nm and 80 nm (25 nm $SiO_2$);
top gate insulator 22 between 1 nm and 15 nm (2.5 nm $SiO_2$);
top gate 21 between 5 nm and 100 nm (25 nm Tungsten);
gate pillar 19, thickness of a few nanometers and more (75 nm Silicon Nitride);
top gate sidewall insulators 18.1, 18.2 between 5 nm and 50 nm (15 nm $SiO_2$);
source/drain sidewall extensions 17.1, 17.2 between 10 nm and 100 nm (40 nm amorphous Silicon);

It is immediately visible from FIG. 1, that the FET's structure is highly symmetrical and that the top gate 21 is precisely aligned to the bottom gate 13. The lateral extension of the bottom gate 13 together with the bottom gate sidewall insulators 12 is approximately the same as the lateral extension of the channel 15 together with the drain region 20.1 and source region 20.2.

Figure 2:
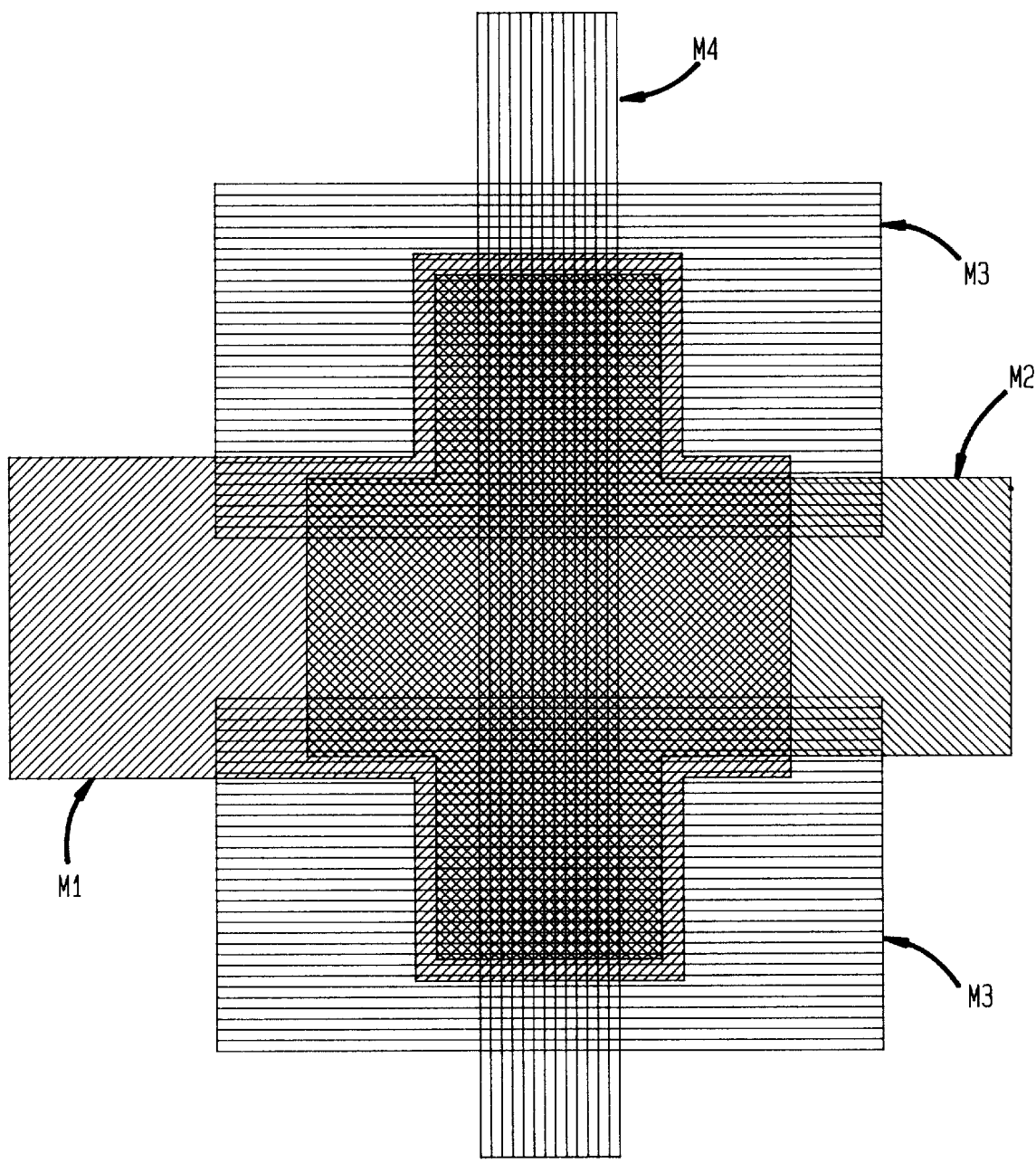
FIG. 2 is a schematic illustration of the masks which may be used to make the self-aligned double gate field effect transistor shown in FIG. 1.

A schematic view of the four lithographic masks M1–M4, used to make the FET 10, is given in FIG. 2. The first mask M1 is used to define the bottom gate 13. The second mask M2 defines the size and shape of the top gate 21. The third mask M3 is employed to define the sidewall area 16.1, 16.2, 17.1, 17.2, 18.1 and 18.2. The last mask M4 may be used to define source and drain interconnects (not shown in FIG. 1).

A method according to the present invention is now described in connection with a sequence of FIGS. 3A through 3H. Please note that the device 47 (second embodiment) is slightly different from the first embodiment. The main distinguishing feature is the substrate which comprises a handle wafer 34 and an insulating layer 35. The second embodiment is an SOI implementation of the present invention.

Figure 3A:
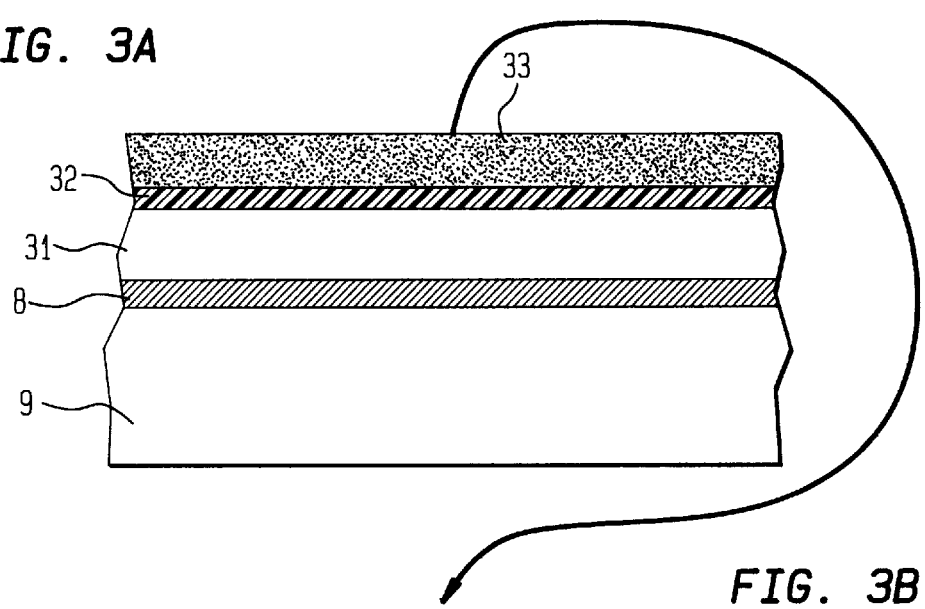
FIGS. 3A–3H is a schematic illustration of the method steps for making self-aligned double gate field effect transistors, according to the present invention.
Figure 3B:
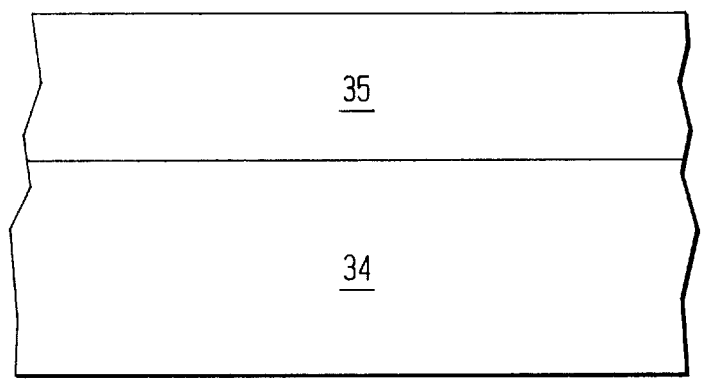

In the following sequence of steps, according to the present invention, conventional silicon integrated circuit technology is used. In order to obtain the initial layer sequence 31, 32, 33, 35, and 34, a bonding technique may be used. First, an epitaxial silicon layer 31 is grown on a silicon wafer 9. This epitaxial silicon layer 31 may comprise an etch stop layer, or a cleavage layer 8 may be provided between the epitaxial silicon layer 31 and the substrate 9, as illustrated in FIG. 3A. The silicon layer 31 is then oxidized to produce a bottom gate oxide 32. The thickness of the bottom gate oxide 32 depends on different parameters such as the duration of oxidization, for example. In a next step, a bottom gate layer 33 is formed. The bottom gate layer 33 can be formed by means of deposition, for example. Now, this structure 31, 32, 33 is flipped over and attached to an oxide 35 covered handle silicon wafer 34, as shown in FIG. 3B.

As mentioned above, the structure 31, 32, 33 can for example be bonded to the oxide 35 of the handle silicon wafer 34. Subsequently, the original silicon wafer 9 containing layer 31 is etched back leaving a structure with the unpatterned layer sequence 31, 32, 33, 35, 34 on top. Likewise, the silicon wafer 9 may be removed by cleaving along layer 8. If the epitaxial silicon layer 31 comprises an etch stop layer, this epitaxial silicon layer 31 is etched back down to this etch stop layer. Since there are different ways to obtain such an unpatterned layer sequence, no illustration is given. The starting layers (layers 31, 32, 33, see FIG. 3A) are unpersonalized. The bottom gate is not structured (patterned) prior to the fabrication of the channel layer 15. This is very important since it permits the built up of an inventory of starting wafers (partially processed wafers) and the attainment of a high degree of perfection for these wafers.

Figure 3C:
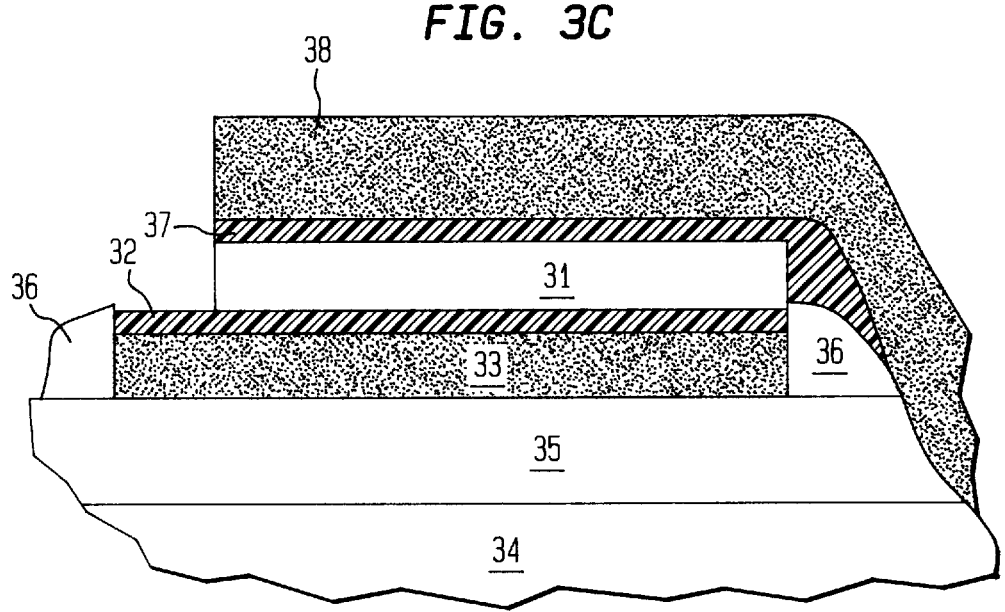

Referring now to FIG. 3C, the next sequence of steps is described. The layers 31–33 are partially patterned using a mask similar to the mask M1 in FIG. 2. Then, silicon dioxide sidewalls 36 are formed and the uppermost portion of the channel layer 31 is oxidized to from layer 37. Instead of oxidizing the channel layer 31, one may likewise form an oxide layer 37 on top of layer 31 (As illustrated in FIG. 3C). A top gate layer 38 is now deposited on top of the oxide layer 37. Please note that this top gate layer 38 may overlap the layers underneath, because the sidewall 36 permits the top gate 38 to cross over the bottom gate 33 without causing a short circuit. A mask similar to mask M2 (see FIG. 2) is now used to partially pattern the top gate 38, oxide layer 37, and channel layer 31 using the bottom gate oxide 32 as the etch stop. At this stage of the inventive method, the channel area remaining is formed by the overlap of the two masks M1 and M2.

Figure 3D:
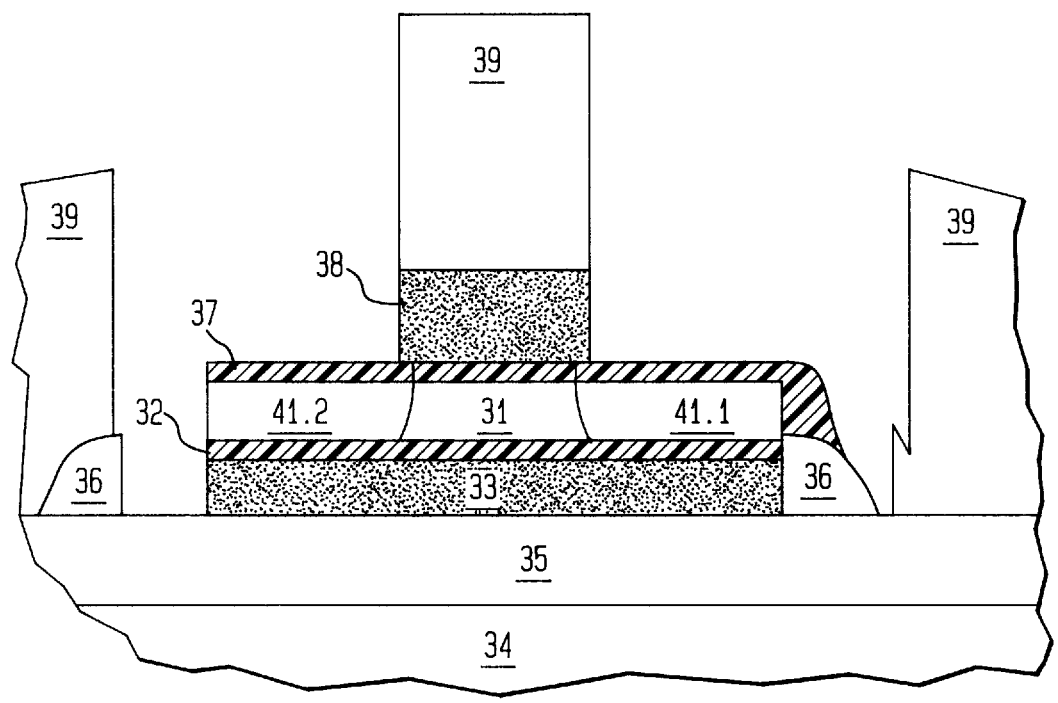

The next steps are now described in context with FIG. 3D. A thick insulator 39 is now deposited followed by an anisotropical etch step using a mask similar to mask M3 of FIG. 2. This etch step stops on the top gate 38, or after etching through the exposed area of the bottom gate insulator 32 (see FIG. 3C) stopping on the exposed area of the bottom gate 33. Next, layer 38 is etched, stopping on the top gate insulator 37, and the exposed area of the bottom gate 33 is etched stopping on the handle insulator 35. The exposed channel layer 31 may now be implanted with an appropriate source/drain implant in order to form the source and drain regions 41.1 and 41.2 shown in FIG. 3D. The source and drain regions 41.1, 41.2 are in the same plane as the channel 31 and are in direct contact with this channel 31 because they are formed in the channel layer by introduction of dopants. At this stage, the shape of the bottom gate 33 is given by M1-(M3 AND NOT M2). The final shape of the top gate 38 is defined by M2 AND NOT M3, as shown in FIG. 2.

Figure 3E:
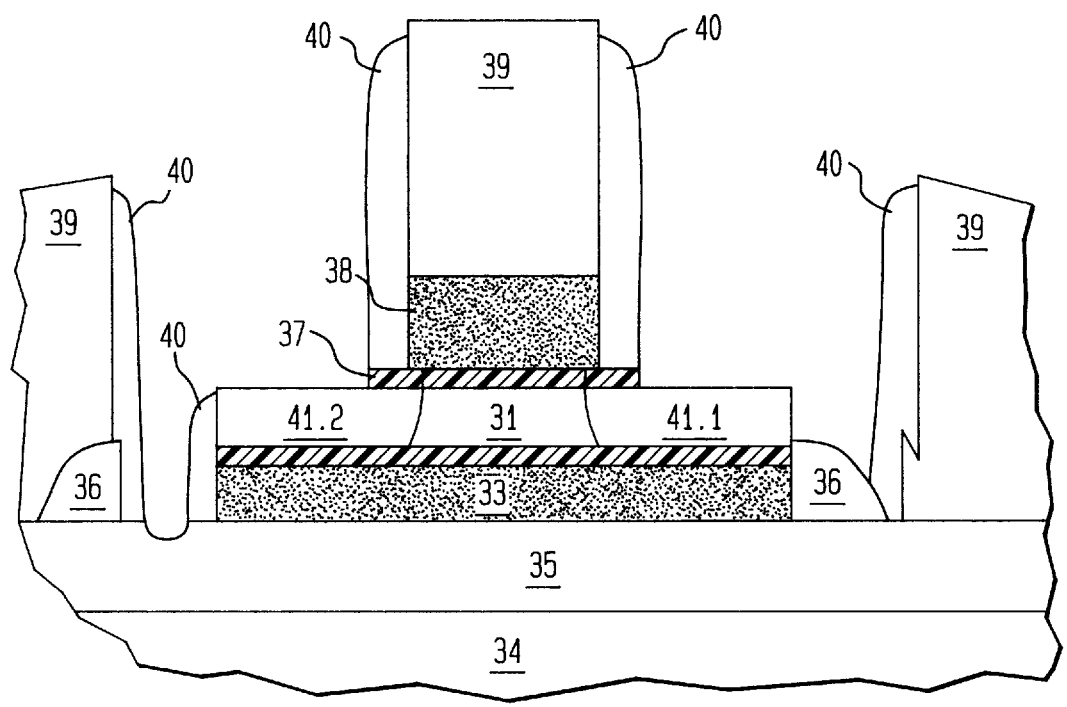

The next step addressed in the following is supported by the illustration in FIG. 3E. As next step, a silicon dioxide layer is deposited and etched back anisotropically to form the sidewalls 40 adjacent to the top gate 38, gate pillar 39, bottom gate 33, bottom gate insulator 32, and channel 31.

Figure 3F:
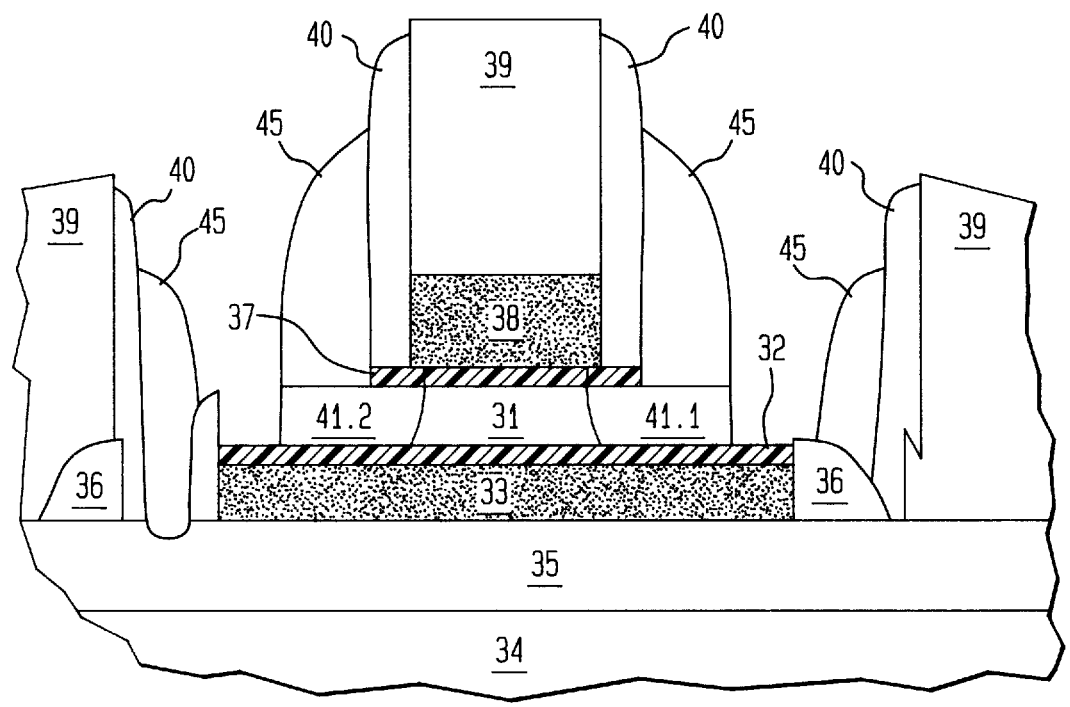

Referring now to FIG. 3F, the next steps are described. A layer of amorphous silicon is deposited and etched back to form sidewalls 45. The etching is continued to remove the exposed horizontal channel regions 41.1 and 41.2 later serving as gate and source, such that part of the bottom gate oxide 32 becomes exposed. The amorphous silicon just deposited is now ion implanted with the appropriate doping. Well suited as dopants are boron, phosphorous, and arsenic, for example. The structure is now annealed resulting in the rapid redistribution of the dopant throughout the amorphous silicon layer, the crystallization of the amorphous silicon to form a region of high conductivity, and driving in of the dopant to augment the doping in the source/drain regions 41.1, 41.2. The remaining channel area (including the source and drain regions) is now defined by M1 AND M2 AND (M3+sidewall 40 & 45).

Figure 3G:
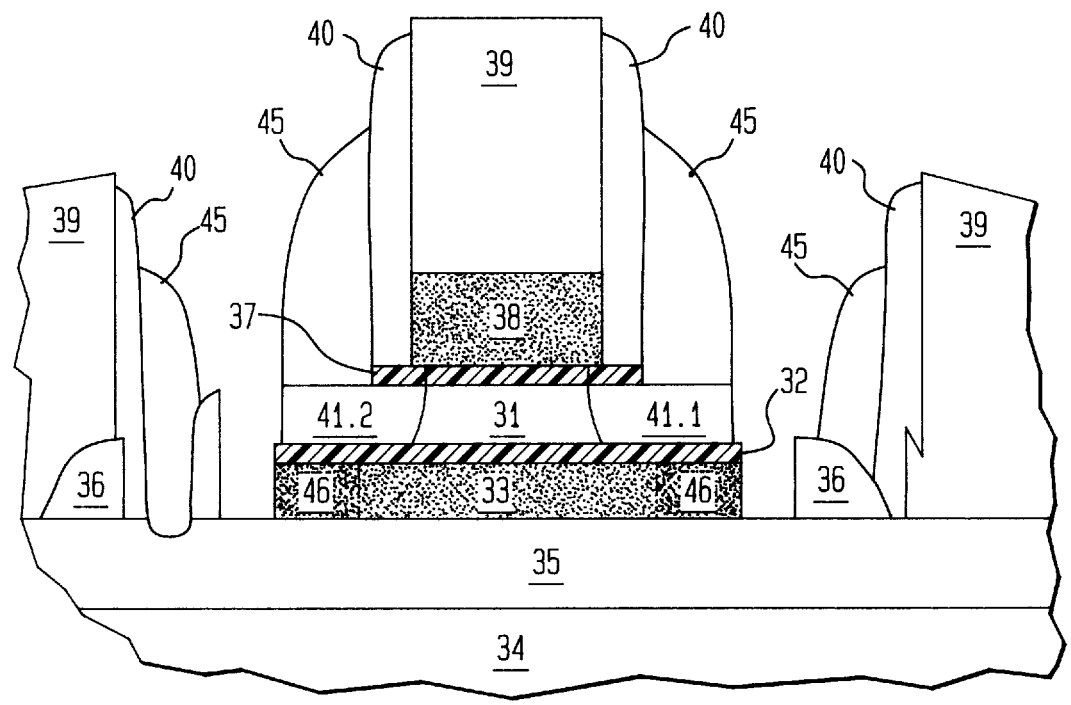

In the following paragraph further steps are described. These steps are illustrated in FIG. 3G. According to the present invention, the structure formed thus far (31, 41.1, 41.2, 37, 38, 39, 40, 45), is now used as etch mask to etch through the bottom gate insulator 32. and the bottom gate 33. The etch is changed to an isotropic etch to undercut the bottom gate insulator 32 and recess the bottom gate 33. A conformal insulator is then deposited to fill the recess. This conformal insulator is now etched back with an anisotropic etch, to leave the insulator 46 in the recessed enclaves underneath the bottom gate insulator 32 and adjacent to the bottom gate 33.

Figure 3H:
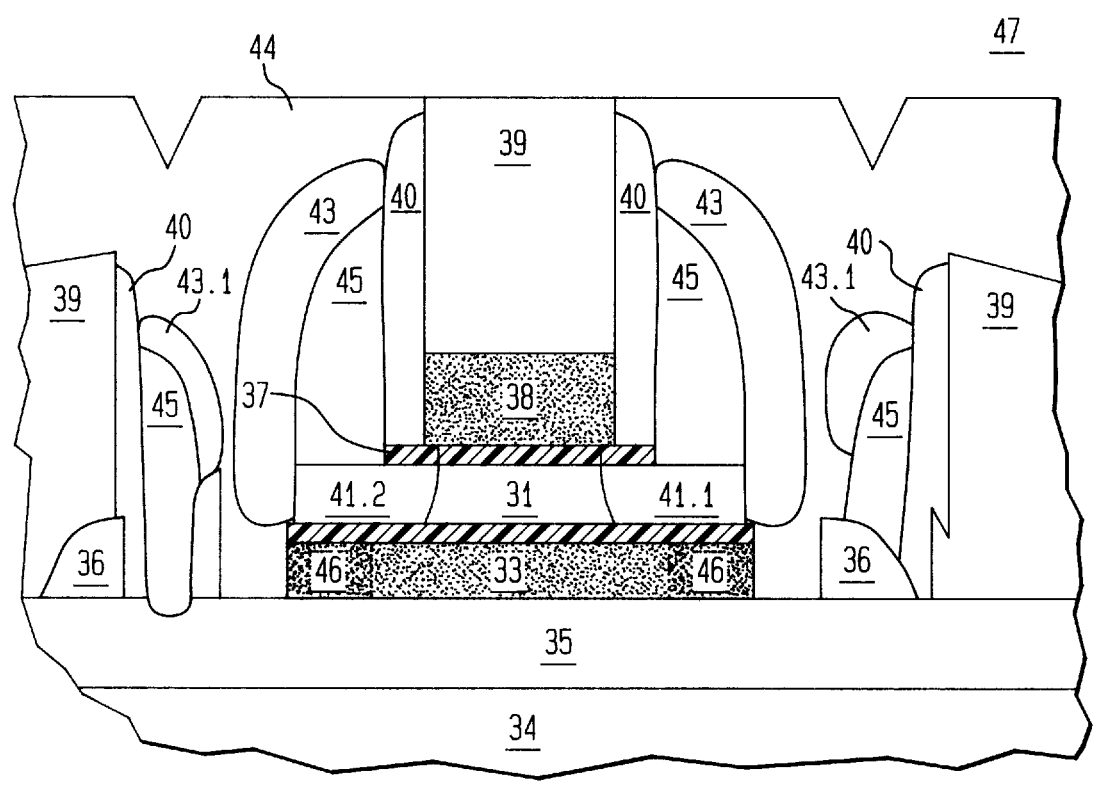

Referring to FIG. 3H, the final steps are described. Now silicide sidewall layers 43 are formed. This can be done by siliciding the exposed silicon 45 using a standard self-aligned Silicide (SALICIDE) process, for example. This SALICIDE process is a process where a metal layer is deposited and reacted with with the exposed silicon to form a silicide. Then the unreacted metal is etched off, leaving the silicided regions 43. As illustrated in FIG. 3H, these silicided regions 43 make an electrical connection to the source/drain regions 41.1 and 41.2. A thick conformal metal layer 44 may then be deposited and structured to fill the 'grooves' adjacent to the transistor formed. This metal layer 44 may be etched using a mask M4, for example. One may also polish the upper surface of the structure to remove the metal layer 44 from the gate pillar 39, using a chemical-mechanical polish.

It is important that the metal layer 44 does not serve as short circuit for source 41.1 and drain 41.2.

As shown in FIGS. 3A–3H, some silicide debris 43.1 is left on the outer sidewalls of the structure during the above process. This does not cause any problems since these debris 43.1 are anyway part of the source and drain contact regions.

Where several FETs are formed next to each other, these devices may share either the source or drain contact. The outer sidewall shown at the margin of FIG. 3H may serve as gate of an adjacent FET.

Figure 4:
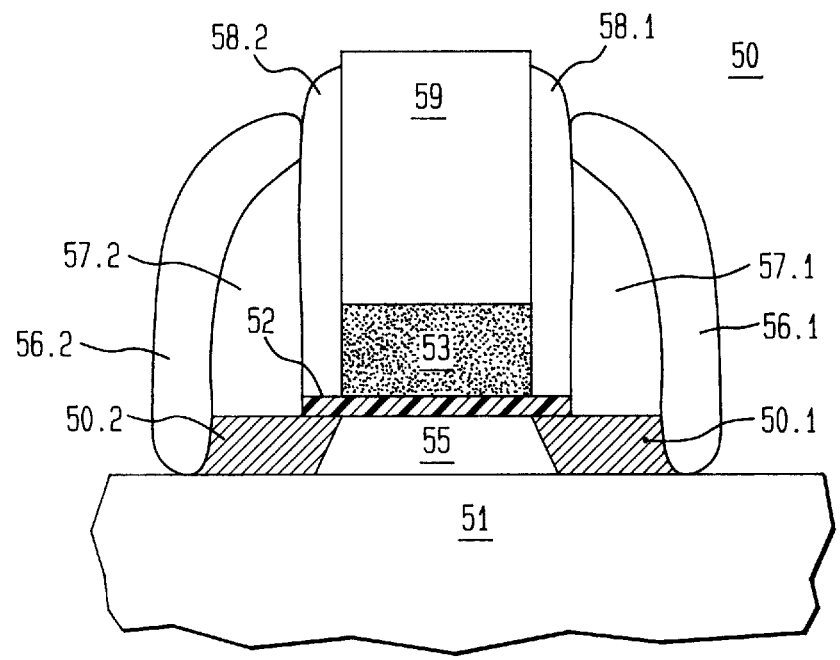
FIG. 4 is a schematic cross-section of another self-aligned single-gate field effect transistor according to the present invention.

Another implementation of the present invention is illustrated in FIG. 4. In this Figure, a single gate field effect transistor 50 is shown. It comprises a single crystal channel 55 being confined between a support structure 51 on one side and a top gate insulator 52 and top gate 53 on the opposite side. Source and drain regions 50.1, 50.2 are an integral part of the channel 55. They are formed in said channel 55 by introduction of suited dopants. A conducting top gate pillar 59 is formed on top of said top gate 53. Top gate sidewall insulators 58.1 and 58.2 cover at least part of the sidewalls of said top gate pillar 59 and top gate 53. Source and drain sidewall extensions 57.1, 57.2 are situated on said source and drain regions 50.1, 50.1 and adjacent to said top gate sidewall insulators 58.1 and 58.2. The field effect transistor 50 may further comprise silicided portions 56.1, 56.2, serving as source and drain contacts and covering part of said source and drain sidewall extensions 57.1, 57.2 and source and drain regions 50.1, 50.2. These silicided portions 56.1, 56.2 can be omitted. As in the other embodiments, the lateral extension of said top gate 53, top gate pillar 59, top gate sidewall insulators 58.1, 58.2, and source and drain sidewall extensions 57.1, 57.2, together approximately define the lateral extension of said channel 55 and source and drain regions 50.1, 50.2 being formed in said channel 55. It is important to note, that all these elements together serving as mask when etching the layers underneath, are precisely aligned with respect to the channel 55. It is further to be noted that the channel 55 with said drain region 50.1 and source region 50.2 together are raised with respect to the support structure 51. This is very important, because it leads to a drastically reduced parasitic capacitance.

Figure 5:
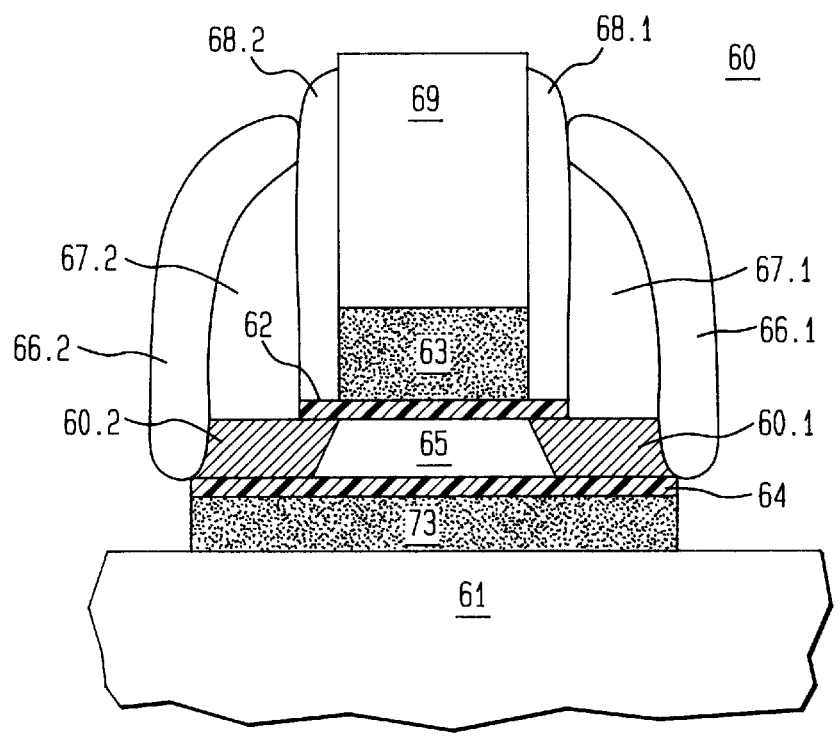
FIG. 5 is a schematic cross-section of another self-aligned double-gate field effect transistor according to the present invention.

Another field effect transistor 60, according to the present invention, is illustrated in FIG. 5. It comprises a support structure 61 on top of which the following layers are formed:

bottom gate 73,
bottom gate insulator 64,
channel 65 with integrated source and drain regions 60.1, 60.2,
top gate insulator 62,
top gate 63,
gate pillar 69,
top gate sidewall insulators 68.1, 68.2, and
source and drain sidewall extensions 67.1, 67.2.

The field effect transistor 60 of FIG. 5 further comprises optional silicided portions 66.1 and 66.2. The bottom gate 73 is self-aligned with respect to the top gate 63.

The above implementations of the present invention can be further modified as follows:

Layer 21, 38, 53, or 63 may be silicided polysilicon. This silicided polysilicon may be deposited as a silicide/amorphous silicon sandwich, and doped n-type or p-type for a n-channel or p-channel FET, respectively. This would provide a lower threshold voltage than the gates described in connection with FIGS. 1 and 3A–3H, for example.

The channel layer 15, 33, 55, or 65 may be etched using the silicon dioxide sidewall 18.1, 18.2, 40, 58.1, 58.2, or 68.1, 68.2 as a mask prior to the amorphous silicon deposition leading to the formation of layers 17.1, 17.2, 45, 57.1, 57.2, or 67.1, 67.2. This has the advantage of a shorter etching time for the amorphous silicon and a closer proximity of the heavily doped amorphous silicon to the channel 15, 31, 55 or 65. The disadvantage is that the vertical interface between the amorphous and single crystal silicon may be harder to clean.

The amorphous silicon 17.1, 17.2, 45, 57.1, 57.2, or 67.1, 67.2 may be doped in-situ, or it may be doped from a diffusion source.

The doped regions 20.1, 20.2, 41.1, 41.2, 50.1, 50.2, or 60.1, 60.2 may be doped by diffusion from the amorphous silicon layers 17.1, 17.2, 45, 57.1, 57.2, or 67.1 and 67.2.

An additional silicon dioxide layer (not shown) may be deposited after the silicide formation and before depositing the source/drain interconnects 44. This additional layer may be etched back to leave a thicker insulator separating the bottom gate from the source/drain interconnect metal 44.

The bottom gate 13, 33, or 73 may be etched after the silicide formation.

Mask M4 may be omitted and the polishing continued until the metal layer 44 is removed from the field area (regions coated by the nitride 39 outside the device area).

The interconnect metal 44 may be removed from over the gate using an aligned mask (M4 with an opening above the gate). This is possible since the lateral extent of the sidewall, as shown in FIG. 1, is greater than an alignment tolerance.

The interconnect layer 44 may be omitted entirely (as illustrated in FIG. 1), allowing the silicide contacts 16.1 and 16.2 to be contacted directly with back-end-of-the-line vias.

The mask M4 may be omitted and the polishing continued until the metal layer 44 is removed from the field area (regions coated by the nitride 39 outside the device area). This will leave layer 44 over the source and drain contacts, filling the donut, to allow easy contact by back-end-of-the-line vias.

The bottom gate 73 in FIG. 5 may also be etched back, in order to provide room for insulators similar to the insulators 46 in FIG. 3H.

The FET 50 may be made on top of an insulating layer (not shown in FIG. 4) in order to electrically isolate it from the support structure 51.

The present FETs can be made on different kind of support structures. Typical support structures are silicon-on-insulator (SOI) substrates and conventional semiconductor substrates, just to give two examples.

It is a key feature of the present invention that the sidewall source/drain together with the top gate, the gate pillar and the top gate sidewall insulators serve as a mask structure. This mask structure serves as an etch mask to at least etch through the layer which later serves as channel with integrated source/drain regions (see FIG. 4, for example). This etch mask may also be used to etch through the bottom gate insulator and the bottom gate (see FIG. 1, for example). I.e., the lateral extension of the channel 15 (31 in FIG. 3H) source/drain regions 20.1 and 20.2. (41.1 and 41.2 in FIG. 3H), the bottom gate insulator 14 (32 in FIG. 3H) and the bottom gate 13 (33 in FIG. 3H) is defined by the lateral extension of this mask structure. It is another important feature that self-aligned silicide source and drain contacts 16.1, 16.2 (43 in FIGS. 3G–3H) are formed in a subsequent step. The way these steps are carried through, allows to make a structure where the bottom gate, source/drain contacts, source/drain extensions, the source region and the drain region are all automatically aligned (referred to as self-alignment) to the top gate.

An additional degree of self-alignment can be achieved by aligning the source and drain interconnects to the gate pillar by means of a planarization step.

A modification of the present double gate FET is a structure where the bottom gate has a thicker oxide, and hence less control than the top gate. This structure still retains most of the scaling advantages of the symmetrical structure presented herein. The bottom gate, for the modified device, is used mainly for the purpose of threshold voltage control in order to manage the speed or standby current when in active or standby modes. Such power management techniques are getting more and more important in todays computer environment. The double gate FET with thicker bottom gate oxide can be made using any of the inventive methods described above.

The invention is described for single FETs (n- or p-channel). For a complementary technology, at least two additional masks are needed to mask out the selective p- and n-implants. The inventive process can be used to make any kind of discrete semiconductor devices, as well as integrated devices such as very large scale integrated (VLSI) and ultra large scale integrated (ULSI) devices, for example. The inventive method is well suited for making random access memories (RAMs), read only memories (ROMs), erasable programmable read only memories (EPROMs), electrically erasable programmable read only memories (EEPROMs), and programmable logic arrays (PLAs)

We claim:

1. Method for making a field effect transistor (50) on a support structure (51), comprising the steps of:

(a) forming a channel layer (55), (b) forming a top gate insulator layer (52) on said channel layer (55), (c) forming a top gate (53) on said top gate insulator layer (52), (d) forming a gate pillar (59) on said top gate (53), (e) forming insulating sidewall layers (58.1, 58.2) adjacent to said top gate (53) and gate pillar (59)

(f) forming an integral drain region (50.1) and source region (50.2) within said channel layer (55) by introduction of dopants, (g) forming conductive amorphous silicon sidewalls (57.1, 57.2) on either side of, and adjacent to said insulating sidewall layers (58.1, 58.2), one of said amorphous silicon sidewalls (57.1) being connected to said drain region (50.1) and one (57.2) being connected to said source region (50.2), (h) etching said channel layer (55) using said top gate (53), gate pillar (59), insulating sidewall layers (58.1, 58.2), and amorphous silicon sidewalls (57.1, 57.2) as mask, thereby transferring the lateral extension of said mask into said channel layer (55), providing for a channel (55) with integral drain region (50.1) and source region (50.2) being raised with respect to said support structure (51).

2. Method of claim 1, wherein said support structure is a semiconductor substrate, or a mounting structure, or a silicon-on-insulator (SOI) substrate.

3. Method of claim 1, wherein part of said top gate insulator layer is removed to expose part of the top surface of said channel layer before carrying out step (f).

4. Method of claim 1, wherein steps (c) and (d) comprise the following sub-steps:

forming a top gate layer, forming a gate pillar layer on said top gate layer, and structuring said gate pillar layer and top gate layer in order to form said gate pillar and top gate.

5. Method of claim 1, wherein a bottom gate insulator layer is formed underneath said channel layer and a bottom gate layer underneath said bottom gate insulator layer.

6. Method of claim 5, wherein said bottom gate insulator layer and bottom gate layer are etched using said mask, thereby transferring the lateral extension of said mask into said bottom gate insulator layer and bottom gate layer, providing for a double gate field effect transistor with a bottom gate being raised with respect to said support structure.

7. Method of claim 1, wherein said insulating sidewall layers (40) are formed by:

deposition of an insulating layer and anisotropically etching said insulating layer.

8. Method of claim 1, wherein said amorphous silicon sidewalls are formed by:

depositing a layer of amorphous silicon and etching said layer of amorphous silicon.

9. Method of claim 1, wherein the exposed portions of said amorphous silicon sidewalls (57.1, 57.2) are silicided to provide conductive Silicide portions being connected to said drain region and source region.

10. Method of claim 9, wherein a metal layer is deposited on said Silicide portions.

* * * * *